United States Patent
Roux et al.

(10) Patent No.: US 7,665,202 B2
(45) Date of Patent: Feb. 23, 2010

(54) METHOD FOR MAKING AN ACOUSTIC TRANSDUCER

(75) Inventors: Gerard Roux, Opio (FR); Sylvie Ponthus, Valbonne (FR)

(73) Assignee: Thales, Neuilly sur Seine (FR)

( * ) Notice: Subject to any disclaimer, the term of this patent is extended or adjusted under 35 U.S.C. 154(b) by 0 days.

(21) Appl. No.: 11/997,244

(22) PCT Filed: Jul. 20, 2006

(86) PCT No.: PCT/EP2006/064472

§ 371 (c)(1),
(2), (4) Date: Jan. 29, 2008

(87) PCT Pub. No.: WO2007/012604

PCT Pub. Date: Feb. 1, 2007

(65) Prior Publication Data

US 2008/0197754 A1    Aug. 21, 2008

(30) Foreign Application Priority Data

Jul. 29, 2005    (FR) .................................... 05 08132

(51) Int. Cl.
 *H04R 31/00*    (2006.01)
 *H01L 41/04*    (2006.01)
(52) U.S. Cl. .................. 29/594; 29/25.35; 310/334
(58) Field of Classification Search ............... 29/25.35, 29/25.42, 592.1, 594; 310/334, 336, 311, 310/364; 367/155
See application file for complete search history.

(56) References Cited

U.S. PATENT DOCUMENTS 4,564,980 A * 1/1986 Diepers .................. 29/25.35
5,539,965 A * 7/1996 Safari et al. ............. 29/25.35

(Continued)

FOREIGN PATENT DOCUMENTS

EP    0 694 339 A    1/1996

OTHER PUBLICATIONS

Cochran A et al.: "Multilayer Piezocomposite Transducers for Applications of Low Frequency Ultrasound." Proceedings 1997 IEEE Ultrasonics Symposium, Toronto, Canada, Oct. 5-8, 1997, vol. 2, 1997, pp. 1013-1016. XP010271441, ISBN: 0-7803-4153-8, pp. 1014.

(Continued)

*Primary Examiner*—Minh Trinh
(74) *Attorney, Agent, or Firm*—Lowe Hauptman Ham & Berner, LLP

(57) ABSTRACT

The present invention relates to a process for producing a block of low-frequency piezoelectric composite material having rows of superposed ceramic posts embedded in a dielectric. This process includes the production of the block of composite material from two superposed identical half-blocks, produced by cutting into a single pre-machined piezoelectric ceramic block. According to the invention, the block of ceramic material thus constituted is then machined so as to form a structure comprising rows of aligned posts, each post being formed from two elementary posts facing each other in strict alignment. The ceramic structure thus produced is then integrated into an appropriate dielectric matrix. The block thus produced is intended to be used for manufacturing acoustic transducers from composite materials. The invention relates in particular to the field of sonar detectors designed to detect objects located at a relatively short distance from the detector.

6 Claims, 6 Drawing Sheets

U.S. PATENT DOCUMENTS

| | | | |
|---|---|---|---|
| 5,548,564 A | | 8/1996 | Smith |
| 5,625,149 A | * | 4/1997 | Gururaja et al. ............... 73/632 |
| 5,684,884 A | * | 11/1997 | Nakaya et al. ............. 381/190 |
| 5,844,349 A | | 12/1998 | Oakley et al. |
| 6,341,408 B2 | * | 1/2002 | Bureau et al. .............. 29/25.35 |
| 6,441,538 B1 | * | 8/2002 | Spigelmyer ................. 310/334 |
| 6,574,842 B2 | * | 6/2003 | Brenner et al. ............. 29/25.35 |
| 7,103,960 B2 | * | 9/2006 | Aime .......................... 29/594 |

OTHER PUBLICATIONS

Oakely C G et al., "Stacked Composite Piezoelectric materials for 1.5-D Arrays." Proceedings 1997 IEEE Ultrasonics Symposium, Toronto, Canada, Oct. 5-8, 1997, vol. 2, 1997, pp. 923-926, XP010271496, ISBN: 0-7803-4153-8.

* cited by examiner

METHOD FOR MAKING AN ACOUSTIC TRANSDUCER

CROSS REFERENCE TO RELATED APPLICATIONS

The present application is based on International Application No. PCT/EP2006/064472, filed on Jul. 20, 2006, which in turn corresponds to France Application No. 05 08132, filed on Jul. 29, 2005, and priority is hereby claimed under 35 USC §119 based on these applications. Each of these applications are hereby incorporated by reference in their entirety into the present application.

FIELD OF THE INVENTION

The present invention relates to the manufacture of acoustic transducers from composite materials. It relates in particular to the field of sonar detectors designed to detect objects located at a relatively short distance from the detector.

CONTEXT OF THE INVENTION

Prior Art

To obtain an acoustic transducer operating at high frequency, it is known to use composite materials instead of solid ceramics. This is because the use of composite materials, such as 1-3 composites, for example to produce a transducer allows the production of the corresponding acoustic sensor to be simplified. Such a transducer may in particular be completely included within a filling substrate, of the polyurethane type for example, without it being necessary to provide an empty space around the nonactive faces that does not transmit pressure.

The appended FIG. 1 shows schematically the structure of such a composite. This composite consists of ceramic posts 11 of parallelepipedal shape, for example with a square cross section of the order of 1 mm², and a height h. These posts are generally distributed over a plane in the form of orthogonal rows and columns. The mechanical integrity of the array of posts is provided by filling the free spaces between the posts with a suitable dielectric matrix (not shown in the figure). To produce a transducer, all that is then required is to deposit layers of conducting material 12, 13 on the active surfaces of the piece of material used. The transducer thus produced may be mounted on a layer 14 of absorbent or backing material.

A plate of composite material is obtained in a known manner from a solid ceramic plate by machining parallel channels of identical widths that lie along two perpendicular directions. This double machining operation makes it possible to form a simple structure consisting of aligned posts 11.

A block of composite material such as that described above is relatively easy to produce for working frequencies of the order of megahertz. This is because the height h of the ceramic posts to be produced is then small, of the order of a few tenths of a millimeter to one millimeter, which height is relatively easy to obtain by machining a ceramic plate. However, when a block of material suitable for a lower acoustic frequency, of the order of 100 kHz for example, has to be produced from a single ceramic plate, two different technical problems arise.

The first problem encountered lies in the difficulty of machining taller posts, needed to produce a composite with a working frequency of the order of 100 kHz. For such a working frequency, the height of the posts must be several millimeters, but it is difficult to obtain posts with a height of greater than 5 mm by machining. In this case, in conventional machining techniques the machined ceramics often break and a very high scrap rate is observed.

The second important problem encountered when producing low-frequency transducers from a composite material is an electrical one. This is because, as shown in FIG. 1, such a transducer is electrically connected by means of two metal plates 12 and 13 placed on the upper face and on the lower face of the transducer. Each post can then be considered as a capacitor, the capacitance of which is given by the known general expression:

$$C = \varepsilon \frac{s}{h}$$

where $\in$ represents the dielectric constant of the ceramic used, h the height of the post and s its cross section. Each post contributes to the capacitance of the transducer through its individual capacitance. Consequently, the capacitance of a transducer produced from a composite material depends on the thickness of the material, so that a low-frequency transducer will have a lower capacitance than a higher-frequency transducer. For a working frequency of the order of 100 kHz, the value of the capacitance presented by the transducer is so low that it results in poor matching impedance responsible for the appearance of electrical noise, to the detriment of the overall operation of the sensor.

The major drawback of using composite materials to produce transducers operating at a frequency lying around 100 kHz and with good sensitivity therefore lies in the difficulty of producing the transducer and in the limitation of its electrical characteristics, which results in its performance being limited.

A known solution for producing a low-frequency acoustic transducer from a material of 1-3 composite type of a given area having both the desired height h and an electrical capacitance value allowing the electrical noise to be maintained at an acceptable level consists in superposing two or more transducers of the same type that operate at a given frequency and in connecting them in parallel from the electrical standpoint.

The appended FIG. 2 illustrates the device theoretically obtained in an ideal production situation. It shows two identical transducers 21 and 22 represented schematically by their ceramic posts. The two transducers are superposed so that the polarization axes of the ceramic elements are oppositely oriented. A plane metal electrode 23 is interposed in the plane of contact between the two transducers. Two plane electrodes are also placed on the faces 24 and 25 facing the plane of contact and electrically connected together. In this way, from the electrical standpoint, the two transducers 21 and 22 are connected in parallel and their electrical capacitances are added. Furthermore, the superposition makes it possible to artificially produce a transducer comprising ceramic posts 26 formed by the superposition of the posts 11 belonging to each of the transducers 21 and 22 respectively. The height H of each post 26 thus formed is advantageously equal to twice the height h of each of the assembled transducers 21 and 22. What is thus obtained is a transducer having a working frequency half that of the two transducers from which it is formed.

The effectiveness of this solution, which is already known, is dependent on the quality with which the transducers are produced and superposed. This is because, in order for the resulting transducer to operate satisfactorily and have a single resonance peak with an exploitable amplitude, it is necessary for the superposition to be carried out sufficiently precisely, so that, for a given row or column, the superposed posts are strictly in alignment and their faces are identically oriented. Now, the known methods of producing composites used hitherto do not allow the production of composites having sufficiently regular arrangements of posts so that precise positioning of all the posts facing one another after the superposition of several transducers to be possible. In practice, what is generally obtained, as illustrated in FIG. 3, are transducers having an arrangement of posts 31 in more or less straight rows and columns, but the superposition of which has alignment imperfections 33 in the plane of superposition 32. The main consequence of these imperfections is that they lead to a misalignment of some of the reconstituted posts 34 formed by the superposition of the two transducers. This misalignment is manifested by the appearance of losses, and therefore by a great reduction in the amplitude of the resonance peak at the desired working frequency.

SUMMARY OF THE INVENTION

One object of the invention is to provide a method for producing low-frequency transducers, which is suitable for frequencies typically of the order of 100 kHz, which is easy to produce on an industrial scale and which does not have the drawbacks of the transducers produced by simple superposition of existing transducers. For this purpose, the subject of the invention is a process for producing a block of low-frequency piezoelectric composite material consisting of superposed ceramic posts, the interstices between which are filled with a dielectric material. This process comprises the following steps:

a step 1 of machining a ceramic block so as to form an array of parallel bars of rectangular cross section, held in place by a ceramic base;

a step 2 of separating the ceramic block into two identical half-blocks by cutting the initial block in a plane perpendicular to the axis of the bars;

a step 3 of producing a block of twice the thickness by superposing and assembling the two half-blocks, the superposition being carried out so as to bring the bars of each of the half-blocks face to face, a conducting layer being inserted in the plane of superposition of the two half-blocks, the array being held between two ceramic bases;

a step 4 of forming rows of ceramic posts from the bars, by making cuts in the ceramic block that are perpendicular to the bars formed in the previous step;

a step 5 of filling the cavities of the ceramic block with a dielectric material;

a step 6 of eroding the bases; and a step 7 of depositing a layer of conducting material on the external faces of the block of composite material thus produced.

This process advantageously makes it possible to produce a very regular block of composite material as it is produced from two superposable blocks comprising bars of substantially identical profiles as they are produced in one and the same operation from one and the same initial ceramic block.

Once these two blocks have been superposed and assembled, they now form only a single block, of twice the thickness and already partially cavitied, which it is easy to machine so as to form well aligned and correctly superposed posts.

Advantageously, since the bars are machined so as to remain attached to a layer or base of ceramic, the spacing between the bars is kept constant, thereby ensuring that all the bars are precisely superposed and held in position during the operation of producing the posts. This sandwich structure also has the advantage of increasing the strength of the material while the posts are being machined and of limiting the risks of fracture. The ceramic layers are removed by erosion or polishing only after the filling step.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE DRAWINGS

Figure 4:
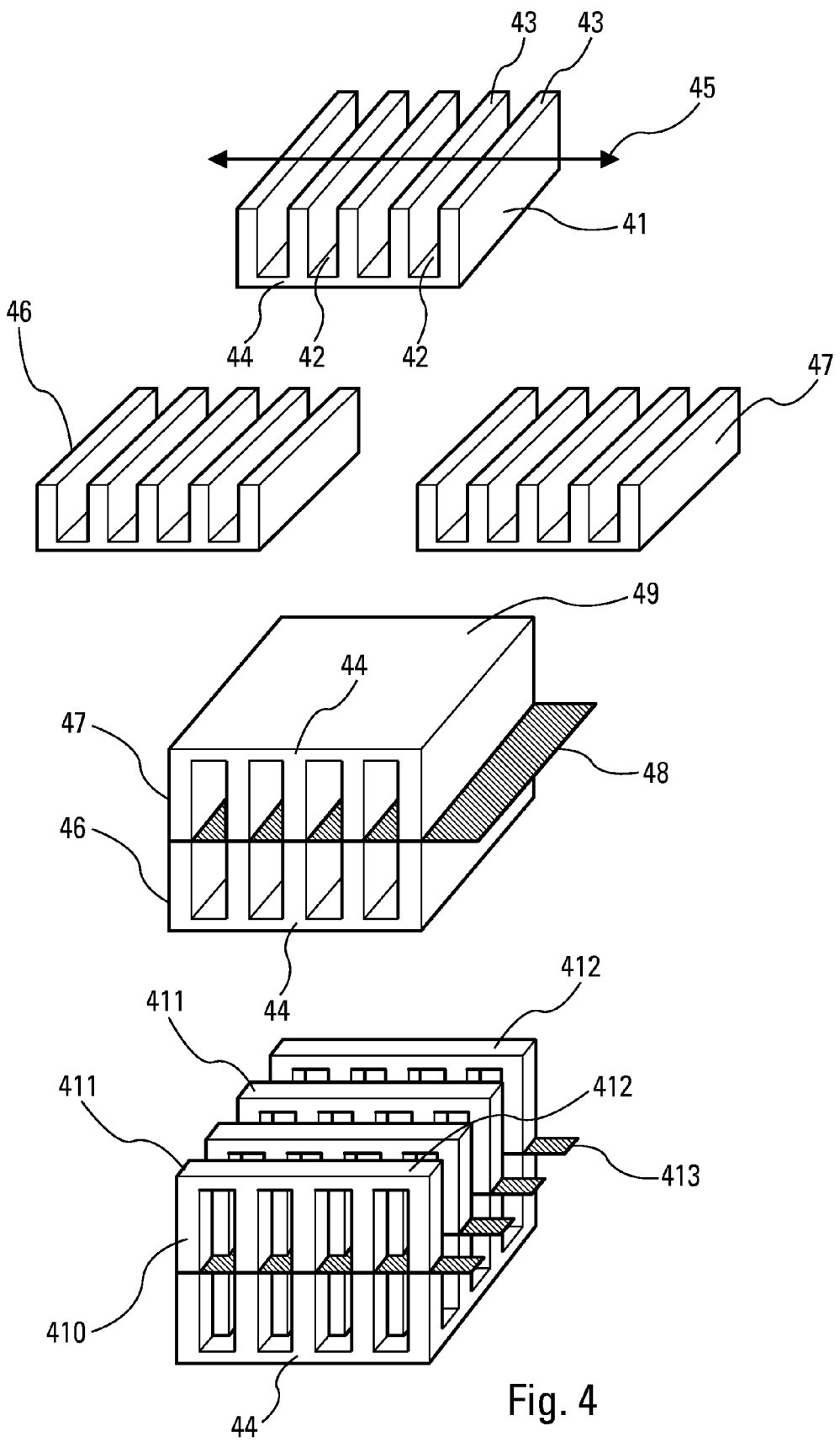
FIG. 4, an illustration of steps 1 to 4 of the process according to the invention.
Figure 5:
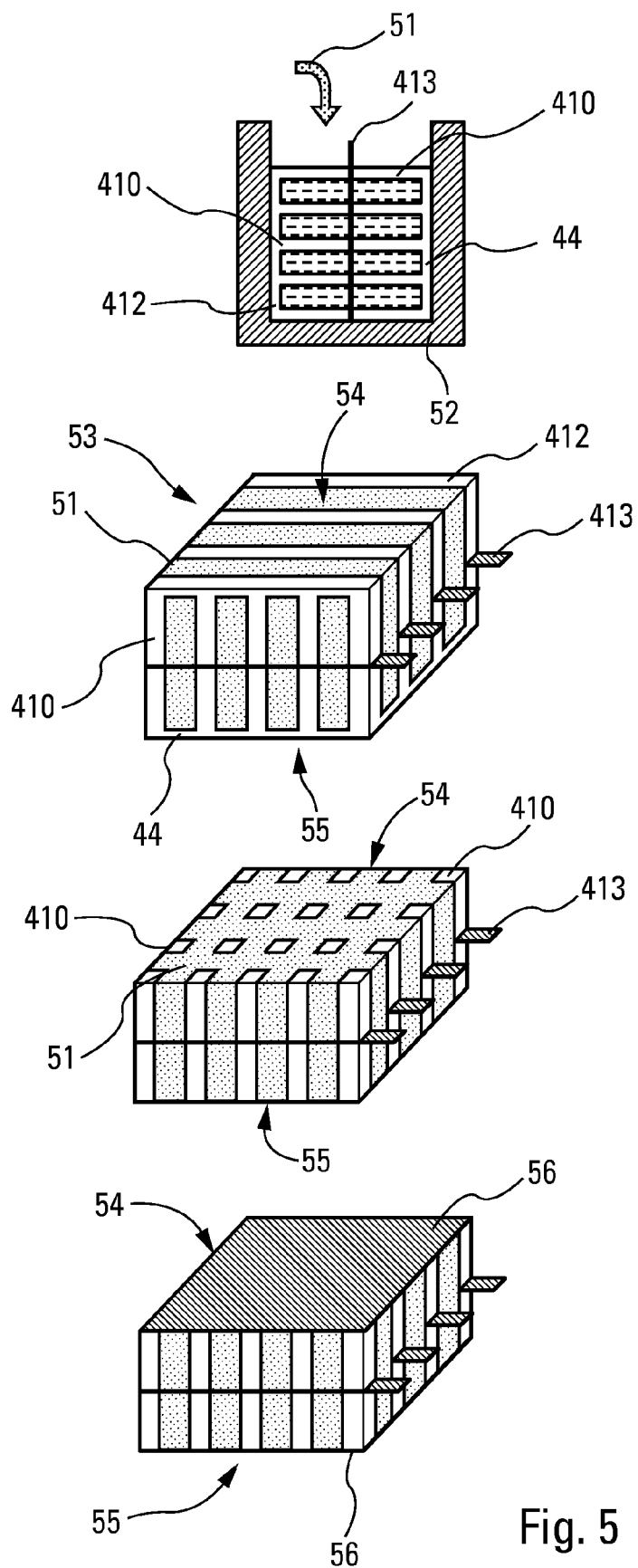
FIG. 5, an illustration of steps 5 to 7 of the process according to the invention.

The process according to the invention may be easily described with the aid of the illustrations shown in FIGS. 4 and 5.

Considering firstly FIG. 4, to produce a low-frequency transducer according to the invention the procedure is as follows. During a first step, a number of parallel grooves 42 are made in a piece of piezoelectric ceramic of thickness h, so as to form an array of parallel bars 43 held rigidly together by a ceramic layer 44 or base, having a preferably small thickness e. Thus an array of parallel bars is obtained, the spacing of which is advantageously well controlled. The grooves 42 may for example be produced by sawing using a well-known technique (not described here).

During a second step, the piece of ceramic thus machined is cut into two identical blocks 46 and 47 in a plane of cutting perpendicular to the axes of the bars and depicted by the axis 45 in the figure. In this way, two twin blocks are obtained which bars are accurately superposable.

Next, during a third step, the two blocks thus obtained are superposed and assembled, for example by bonding. During assembly, a sheet of conducting material, the area of which is greater than that of the blocks 46 and 47, is interposed in the plane of superposition between the two blocks. The sheet of conducting material 48 is positioned so that one of its sides lies outside the block of material 49 thus produced. This block takes the form of bars of thickness 2h held captive between two ceramic layers 44 to which they are solidly attached. These two ceramic layers advantageously ensure that the bars are held in place.

During the fourth step, a series of mutually parallel cuts is made in the block of material obtained in the previous step, these cuts being along axes perpendicular to the axes of the bars 43 that make up the block of material. According to the invention, the grooves thus formed preferably have a width equal to that of the grooves 42 produced during the first step.

Thus, an array of ceramic posts 410 arranged in strictly parallel identical rows 411 is obtained.

Advantageously, during this cutting step the bars are held in position by the external layers 44 that border them. In this way, the sawing operation is carried out while minimizing the risks of fracture. Thus, in any one row 411, the posts 410 are held in position at one end by a ceramic layer 44 and at the other end by ceramic strips 412 resulting from machining the opposed layer.

As illustrated in FIG. 4, after this fourth step the sheet of conducting material is cut into conducting strips 413 connecting all the posts of any one row 411 together.

FIG. 5 is now considered, which illustrates the rest of the steps of the process according to the invention.

As illustrated in this figure, the fourth step is followed by a fifth step that consists in filling the empty spaces that separate the ceramic posts 410 from one another, by pouring a dielectric material 51, for example a polymer, between these posts.

The pouring is for example carried out via the face from which the conducting strips 413 protrude, the other faces being moreover closed off by means of a tool 52 forming a box. As soon as the poured material has solidified, the tool 52 is removed and the block 53 of composite material thus obtained is revealed.

Next, during step 6, this block of material undergoes an operation of eroding the faces 54 and 55 that are parallel to the plane of the conducting strips 413. Owing to the small thickness of the ceramic strips 412 and of the ceramic layer 44, this operation may advantageously be carried out by polishing the surfaces in question. What is thus obtained is a block of composite material that takes the form of an array of ceramic posts 410 imprisoned in a matrix 51 of polymer material.

The complete block of composite material is then finished off during a final step 7. During this step, each of the polished faces 54 and 55 is covered with a layer 56 of conducting material, which operation may consist in metallizing the faces 54 and 55. This layer may be a continuous layer, as shown in the figure, but it is also possible to produce, depending on the envisaged use, more complex metallizations so as for example to form parallel strips identical to the strips 413 buried within the material.

Figure 1:
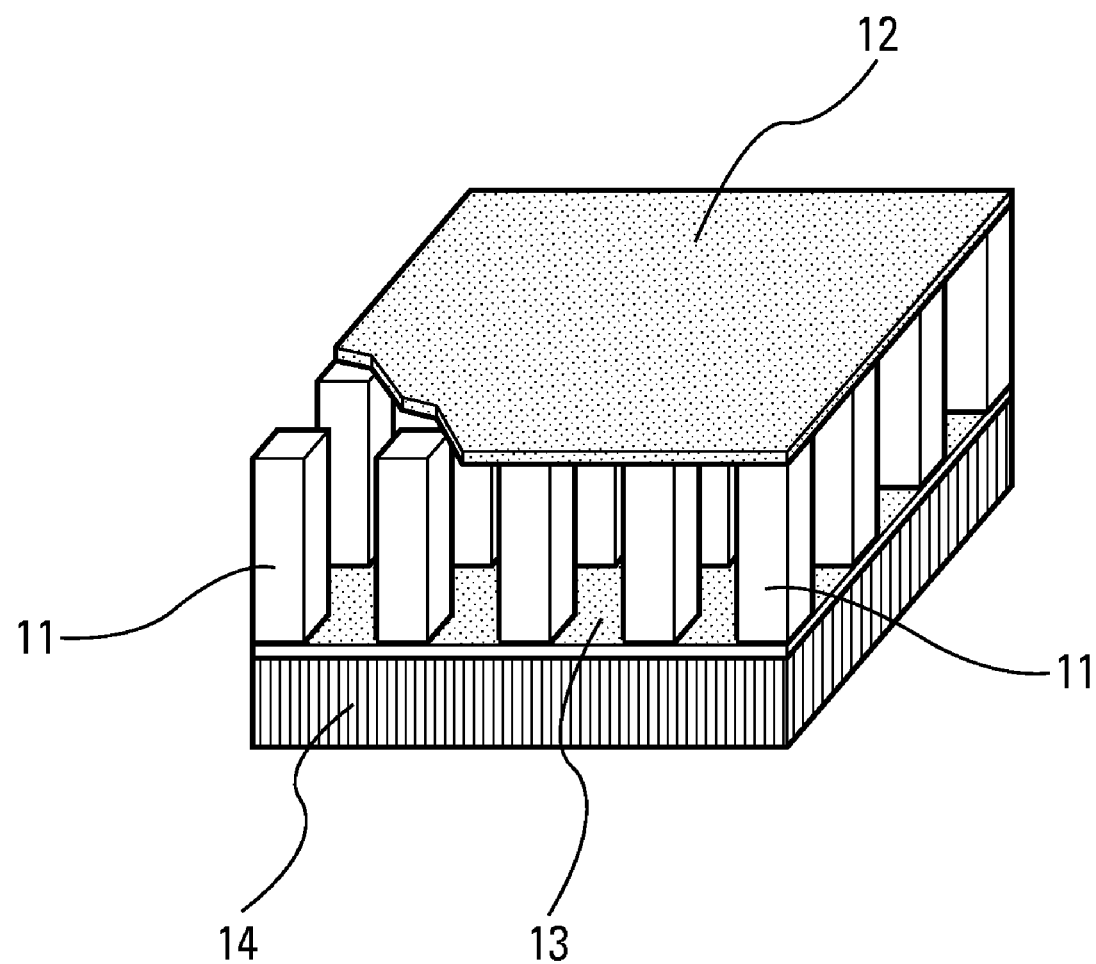
FIG. 1, a schematic representation of a high-frequency transducer produced from a block of composite material.
Figure 2:
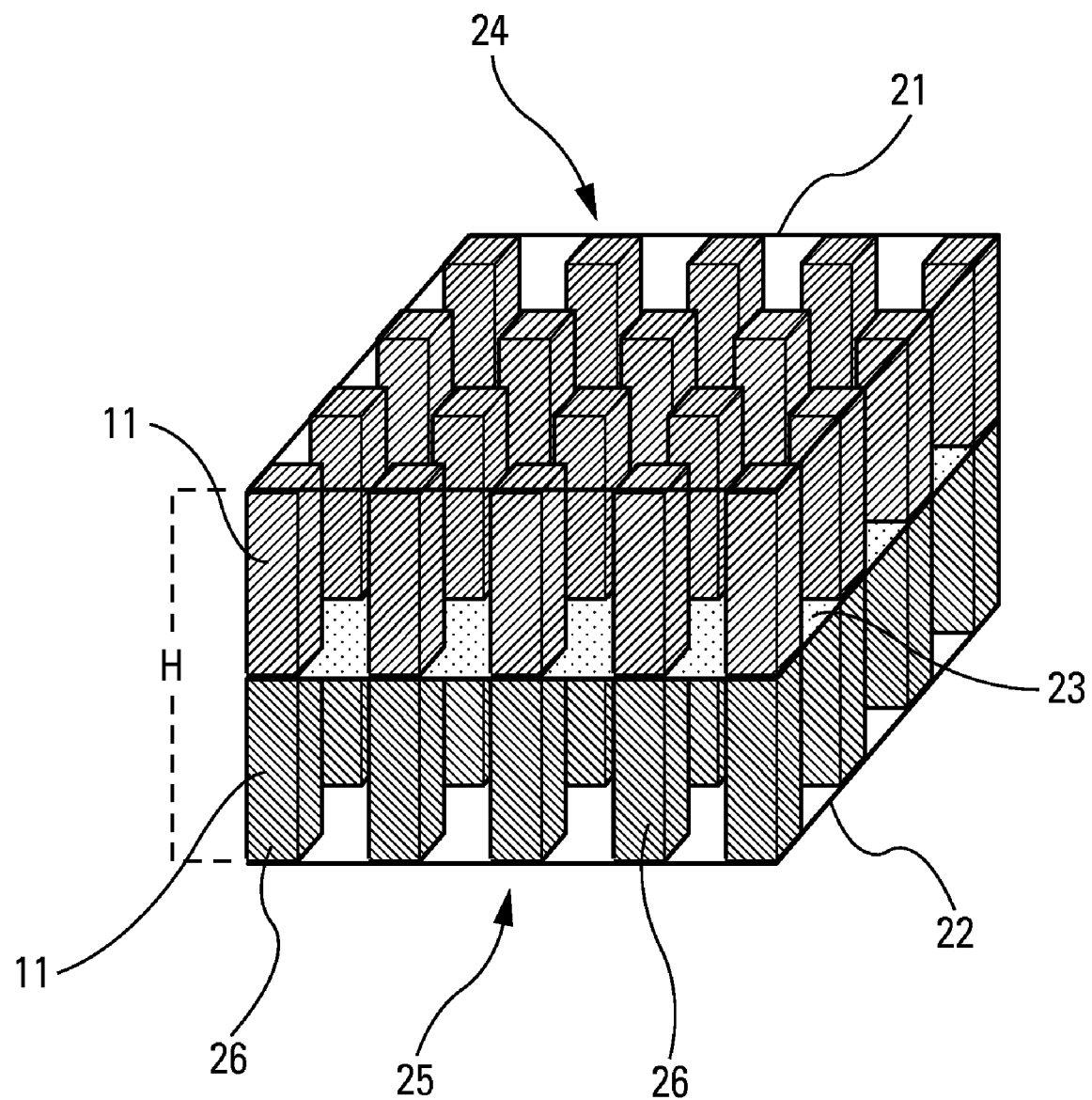
FIG. 2, a representation of an ideal transducer produced by superposing two blocks of composite materials.

A block of composite material thus produced by the process according to the invention advantageously has in the end a structure substantially identical to the structure shown in FIG. 2, which structure, as mentioned above, is extremely difficult to obtain by any known process.

Figure 6:
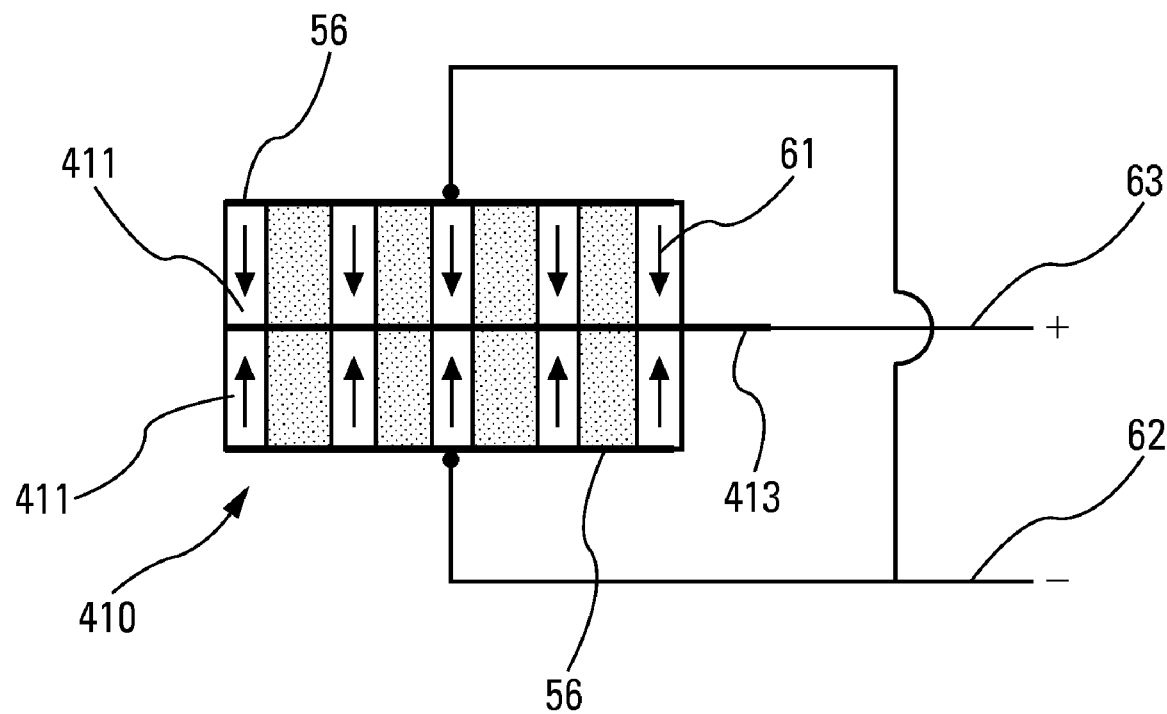
FIG. 6 demonstrates the advantages of producing a transducer from a piece of composite material manufactured by the process according to the invention.

FIG. 6 is now considered, which clearly demonstrates the advantages of producing a transducer from a piece of composite material manufactured by the process according to the invention.

As illustrated in FIG. 6, each column of piezoelectric ceramic posts may be electrically wired so as to connect the posts in parallel. In this form of assembly, the conducting elements 56 of the external faces are electrically connected so as to form a negative pole 62, whereas the internal conducting strip 413 forms a common positive pole 63. As indicated by the arrows 61 in the figure, during manufacture of the piece of composite material, the superposition of the two ceramic elements 46 and 47 is carried out so that the polarization directions of the two elements allow this parallel mounting.

The advantage presented by such an arrangement is considerable. Firstly, it makes it possible to produce a transducer consisting of elements capable of resonating at a lower frequency. Connecting the posts in parallel in the arrangement illustrated by FIG. 6 places the superposed blocks in phase opposition, with the consequence that the resonance of each post at its eigen frequency is highly attenuated and that the resonance of the assembly at half the frequency which represents the desired resonant frequency, is reinforced. This parallel mounting also makes it possible, as was mentioned previously, for the electrical capacitance of the assembly to be twice that of a monolithic transducer of the same thickness.

The wiring diagram shown in FIG. 6 illustrates the way in which each row of posts of a piece of composite material produced by the process according to the invention can be used to constitute a transducer. Each of the rows may then be connected to the others so as to form the complete transducer. The way in which the various rows are connected together depends on the mode of operation of the complete transducer and in particular on the shape of the directivity pattern that it is desired to produce. One simple way of making this connection consists for example in connecting all the rows in parallel. This way of operating is of course not limiting.

Figure 3:
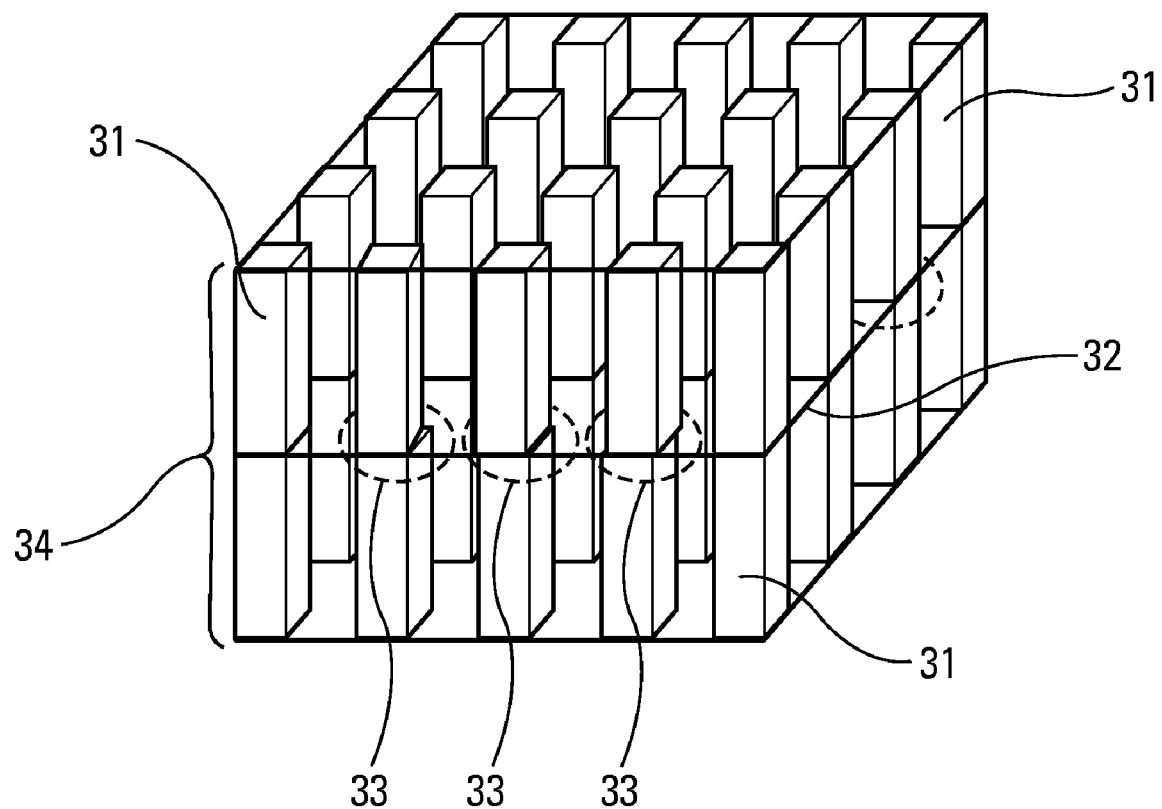
FIG. 3, an illustration of the problems posed by the known methods of production.

The process according to the invention has been described in the above paragraphs in the particular case of producing a transducer having posts of identical size. However, this example is not limiting and it is possible, of course, to generalize the process without departing from the context of the claimed invention. For example, it is possible to produce a structure such as that illustrated by FIG. 3, comprising posts 34 consisting of two posts 33 of two different sizes. To do this, all that is required is to introduce an intermediate step 2a in the process, which takes place between step 2 and step 3, and during which the thickness of one of the two half-blocks is ground so as to give it a different thickness from that of the other half-block. This operation may be carried out by any appropriate means. In this way, the assembly produced during step 3 becomes asymmetrical. In this alternative embodiment, what is obtained is a structure having posts whose capacitance corresponds to the sum of the capacitances of the two posts constituting each half-block, whereas the resonant frequency obtained is then equal to the sum of the two frequencies divided by 4.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A process for producing a block of low-frequency piezoelectric composite material having rows of superposed ceramic posts embedded in a dielectric material, said processing comprising the following steps:

machining a ceramic block so as to form an array of bars of rectangular cross section with parallel axes, held in place by a ceramic layer forming a base;

separating the ceramic block into two identical half-blocks by cutting the initial block in a plane perpendicular to the axes of the bars;

producing a block of twice the thickness by superposing and assembling the two half-blocks, the superposition being carried out so as to bring the bars of each of the half-blocks face to face, a conducting layer being inserted in the plane of superposition of the two half-blocks;

forming rows of ceramic posts from the bars, by making cuts in the ceramic block that are perpendicular to the bars formed during the machining step, the conducting layer lying in the plane of superposition, forming parallel conducting strips connecting all the posts of any one row together;

filling empty spaces that separate the ceramic posts with a dielectric material so as to form a block of composite material;

eroding the external faces of the block of composite material obtained in the previous step, in order to remove the initially formed ceramic bases; and depositing a layer of conducting material on the external faces of the block of composite material thus produced.

2. The process as claimed in claim 1, wherein eroding the external faces of the block of composite material is carried out by polishing.

3. The process as claimed in claim 1, wherein a continuous layer of conducting material is deposited on the external faces of the block during said depositing step.

4. The process as claimed in claim 1, wherein a discontinuous layer of conducting material is deposited on the external faces of the block during said depositing step, said layer forming conducting strips parallel to the conducting strips lying in the plane of superposition.

5. The process as claimed in claim 1, wherein separating the ceramic block into two identical half-blocks is followed by a step of grinding one of the two half-blocks so that the two half-blocks thus obtained have different thicknesses.

6. The process as claimed in claim 5, wherein said grinding step is performed during said separating step.

* * * * *